(12) United States Patent
Campbell et al.

(10) Patent No.: US 8,769,812 B2
(45) Date of Patent: Jul. 8, 2014

(54) PROPAGATING PIN CORRECTIONS THROUGH PHYSICALLY MATING DEVICES

(75) Inventors: Keith M. Campbell, Cary, NC (US); Eric R. Kern, Chapel Hill, NC (US); Caroline M. Metry, Cary, NC (US)

(73) Assignee: International Business Machines Corporation, Armonk, NY (US)

( * ) Notice: Subject to any disclaimer, the term of this patent is extended or adjusted under 35 U.S.C. 154(b) by 1642 days.

(21) Appl. No.: 11/689,632

(22) Filed: Mar. 22, 2007

(65) Prior Publication Data

US 2008/0229576 A1 Sep. 25, 2008

(51) Int. Cl.
*H01R 9/00* (2006.01)
*H05K 3/00* (2006.01)

(52) U.S. Cl.
USPC ........... 29/845; 439/380; 439/381; 439/269.2

(58) Field of Classification Search
USPC .......................... 29/845; 439/380, 381, 269.2
See application file for complete search history.

(56) References Cited

U.S. PATENT DOCUMENTS

| | | | |
|---|---|---|---|
| 4,734,060 A * | 3/1988 | Kawawada et al. | 439/660 |
| 4,797,113 A * | 1/1989 | Lambert | 439/74 |
| 5,098,311 A * | 3/1992 | Roath et al. | 439/295 |
| 5,118,300 A | 6/1992 | Zarreii | |
| 5,309,552 A | 5/1994 | Horton et al. | |
| 5,585,281 A | 12/1996 | Truhitte et al. | |
| 5,877,622 A | 3/1999 | Aoyama et al. | |
| 6,619,965 B1 | 9/2003 | Kihira et al. | |
| 6,663,440 B2 | 12/2003 | Cox et al. | |
| 7,053,480 B2 | 5/2006 | Hauser et al. | |

FOREIGN PATENT DOCUMENTS

| | | | |
|---|---|---|---|
| JP | 11168762 | 6/1999 | |
| JP | 2002056939 A * | 2/2002 | H01R 13/74 |

OTHER PUBLICATIONS

Horne, et al.; A System Interface Design to Accommodate Both an . . . ; Document No. BC990041; pp. 1-6; International Business Machines Corporation, Aug. 24, 1990.

* cited by examiner

*Primary Examiner* — Peter DungBa Vo
*Assistant Examiner* — Jeffrey T Carley
(74) *Attorney, Agent, or Firm* — Edward J. Lenart; Katherine S. Brown; Biggers Kennedy Lenart Spraggins LLP

(57) ABSTRACT

Propagating pin corrections through physically mating devices including bending one of a plurality of connectors of a first mating device; and mating the first mating device having the bent connector with an unmodified second mating device; wherein the mating of the first mating device and the unmodified second mating device bends a connector corresponding to the bent connector of the first mating device.

7 Claims, 8 Drawing Sheets

PROPAGATING PIN CORRECTIONS THROUGH PHYSICALLY MATING DEVICES

BACKGROUND OF THE INVENTION

1. Field of the Invention

The field of the invention is propagating pin corrections through physically mating devices.

2. Description of Related Art

Pin corrections are often necessary on medium to high density connectors. Time and cost to make modifications can be costly to a business and usually require manual labor to propagate.

SUMMARY OF THE INVENTION

Propagating pin corrections through physically mating devices including bending one of a plurality of connectors of a first mating device; and mating the first mating device having the bent connector with an unmodified second mating device; wherein the mating of the first mating device and the unmodified second mating device bends a connector corresponding to the bent connector of the first mating device.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION OF EXEMPLARY EMBODIMENTS

Figure 1:
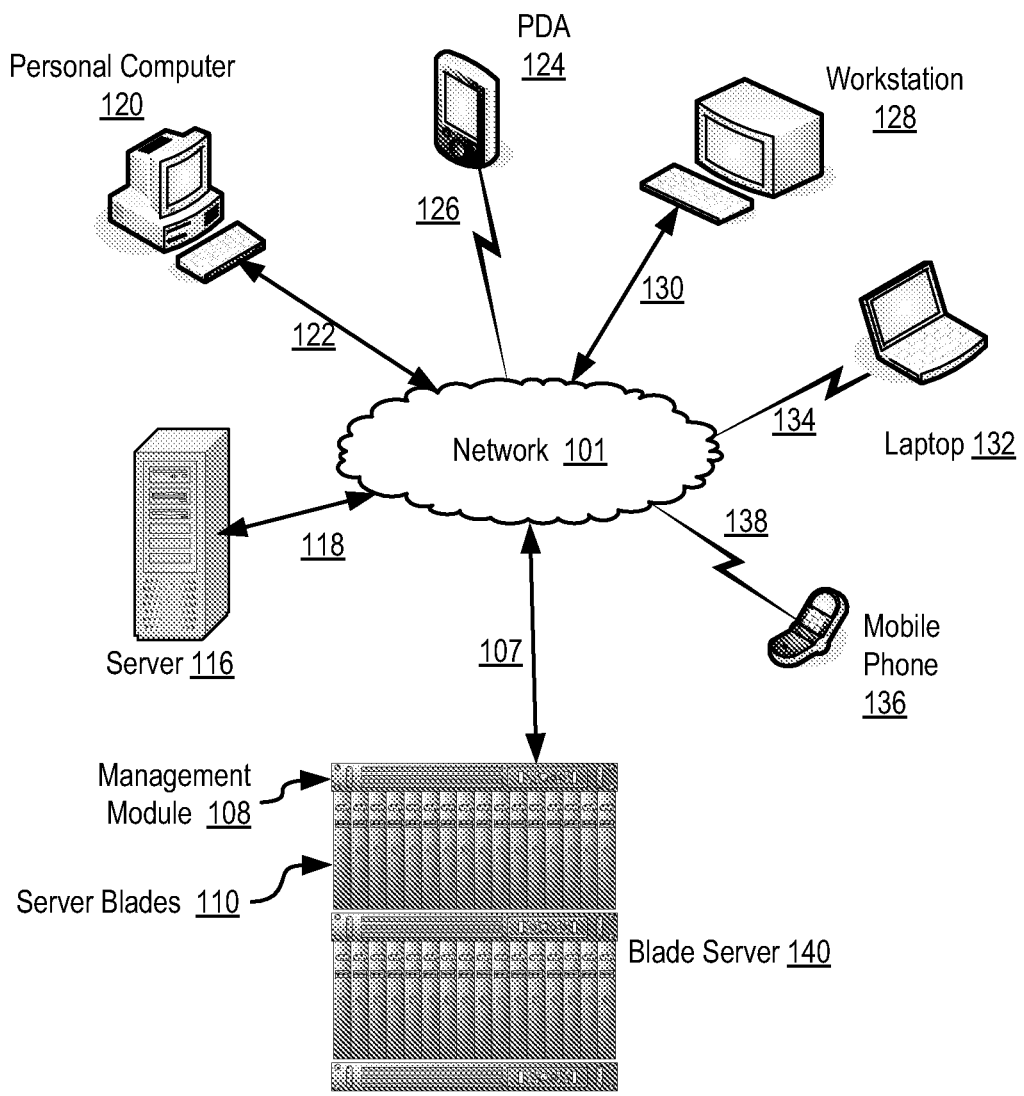
FIG. 1 sets forth a network diagram illustrating an exemplary system of computers in which pin corrections may be propagated through physically mating devices according to embodiments of the present invention.

Exemplary methods and pin benders for propagating pin corrections through physically mating devices according to embodiments of the present invention are described with reference to the accompanying drawings, beginning with FIG. 1. FIG. 1 sets forth a network diagram illustrating an exemplary system of computers in which pin corrections may be propagated through physically mating devices according to embodiments of the present invention. Propagating pin corrections through physically mating devices according to embodiments of the present invention is typically carried out by bending one of a plurality of connectors of a first mating device and mating the first mating device having the bent connector with an unmodified second mating device. Mating the first mating device and the unmodified second mating device bends a connector corresponding to the bent connector of the first mating device thereby propagating the pin correction.

The system of FIG. 1 includes a number of computers (120, 124, 128, 132, 136, 110, 116) having mating devices as one or more components of the computers. Mating devices are devices that are installed through the use of mating, or male-female connectors. The blade server (140) of FIG. 1, for example, has a management module (108) which is connected to the blade server through a male/female mating connection. Similarly, the server blades (110) of the blade server are also connected using a male female mating connection.

The system of FIG. 1 also includes a number of devices (116, 120, 124, 128, 132, 136) that also have as components mating devices. That is, devices whose installation connection is implemented through a mating connection. The server (116) connects to the network (101) through the wireline connection (118). The personal computer (120) connects to the network (101) through the wireline connection (122). The Personal Digital Assistant ('PDA') (124) connects to the network (101) through the wireless connection (126). The workstation (128) connects to the network (101) through the wireline connection (130). The laptop (132) connects to the network (101) through the wireless connection (134). The network enabled mobile phone (136) connects to the network (101) through the wireless connection (138).

The arrangement of servers and other devices making up the exemplary system illustrated in FIG. 1 are for explanation, not for limitation. Data processing systems in which propagating pin corrections through physically mating devices according to the present invention may be implemented may include additional servers, routers, other devices, and peer-to-peer architectures, not shown in FIG. 1, as will occur to those of skill in the art. Networks in such data processing systems may support many data communications protocols, including for example the Transmission Control Protocol ('TCP'), the Internet Protocol ('IP'), the HyperText Transfer Protocol ('HTTP'), the Wireless Access Protocol ('WAP'), the Handheld Device Transport Protocol ('HDTP'), and others as will occur to those of skill in the art. Various embodiments of the present invention may be implemented on a variety of hardware platforms in addition to those illustrated in FIG. 1.

Figure 2:
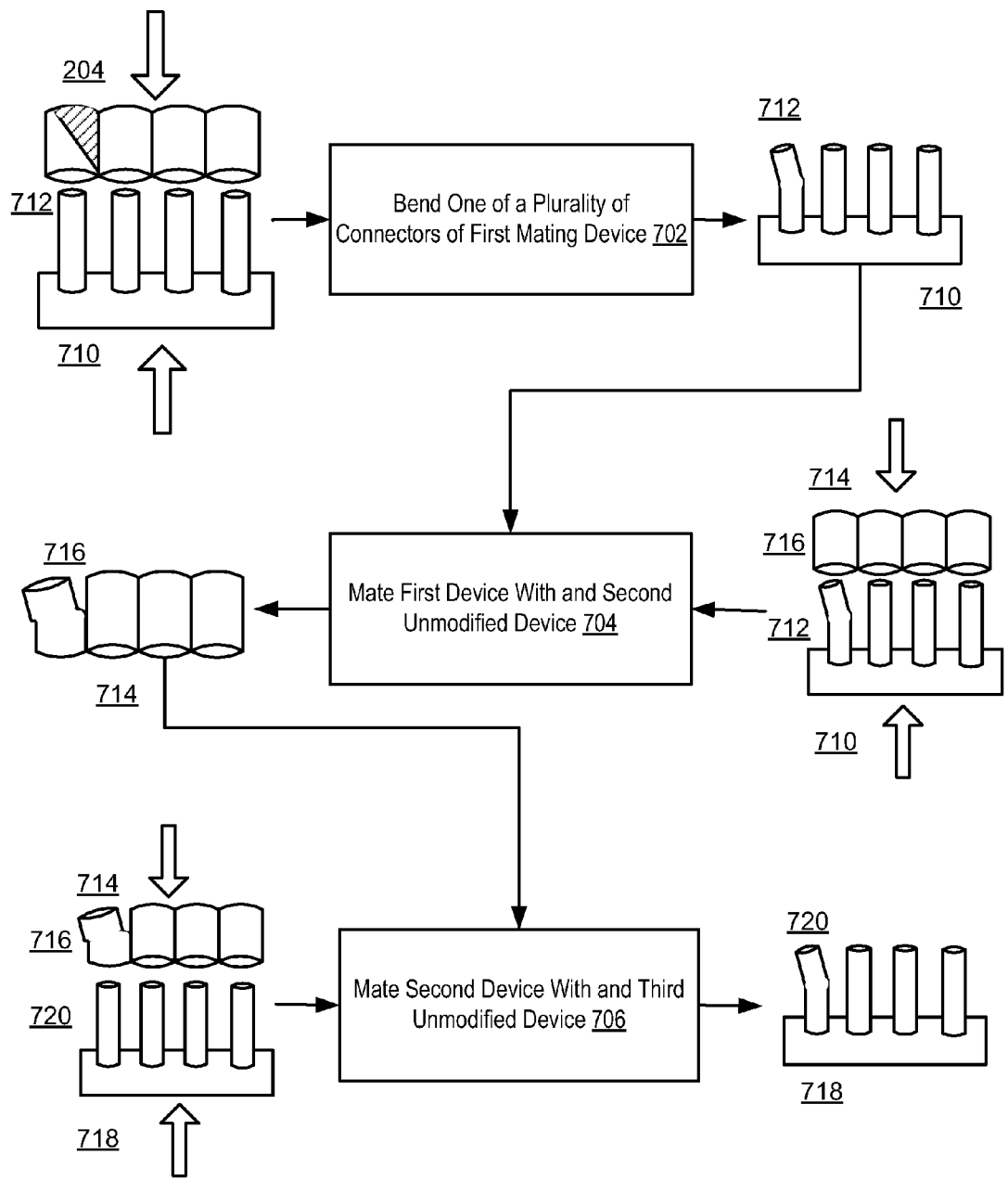
FIG. 2 sets forth a flow chart illustrating an exemplary method for propagating pin corrections through physically mating devices to embodiments of the present invention.

For further explanation, FIG. 2 sets forth a flow chart illustrating an exemplary method for propagating pin corrections through physically mating devices according to embodiments of the present invention. The method of FIG. 2 includes bending (702) one (712) of a plurality of connectors of a first mating device (710). In the example of FIG. 2, the first mating device (710) is a male mating device having a plurality of male connectors. Bending (702) one (712) of a plurality of connectors of a first mating device (710) may be carried out by selecting a male connector (712) on a male mating device (710) and bending (702) the selected male connector (712) to a predetermined angle. Bending (702) the selected male connector (712) to a predetermined angle may also be carried out by inserting the selected male connector (712) into a pin bender (204) having an interior designed to bend the connector at a predetermined angle.

Figure 3:
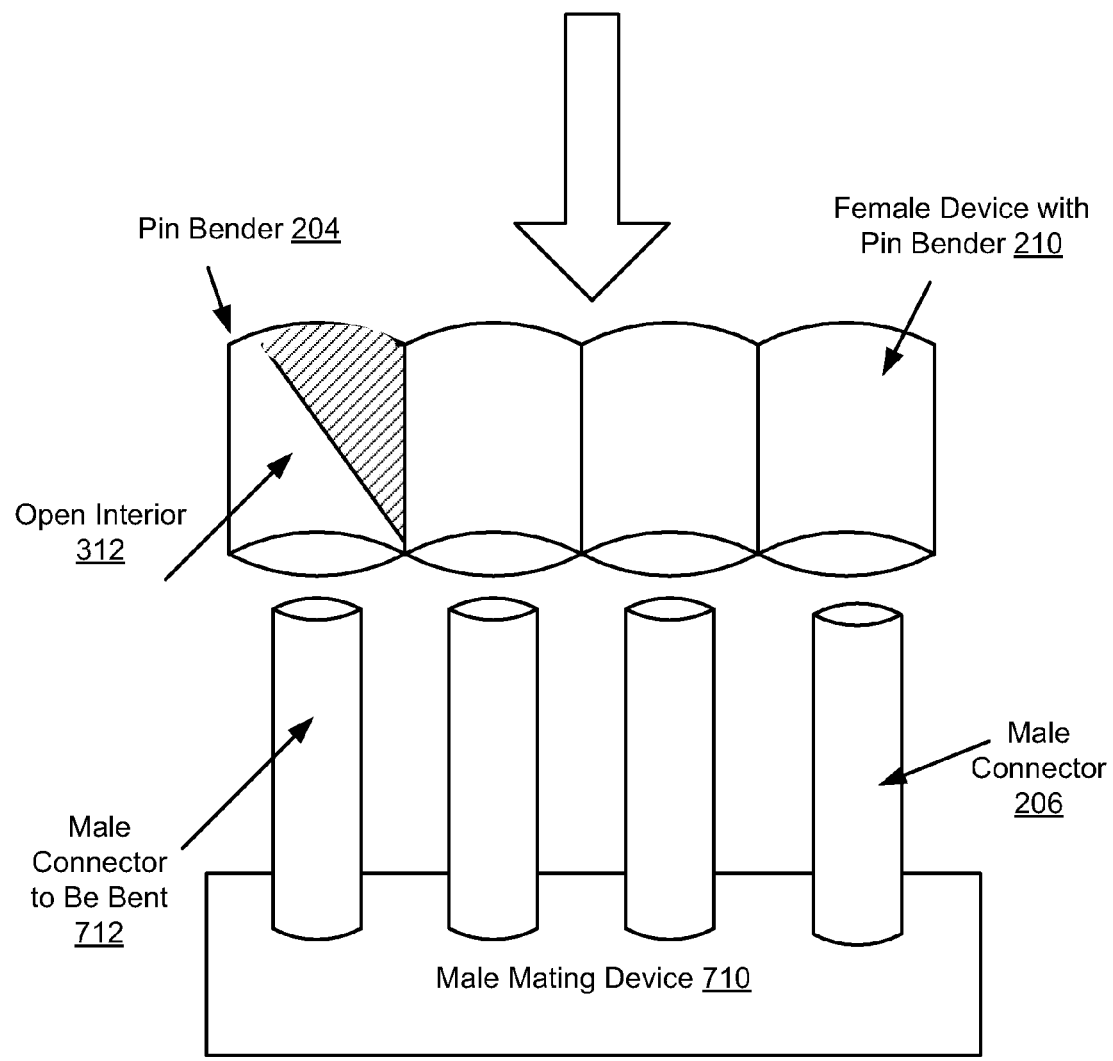
FIG. 3 sets forth a block diagram of a male mating device and a pin bender illustrating bending one of a plurality of connectors of a first mating device.
Figure 4:
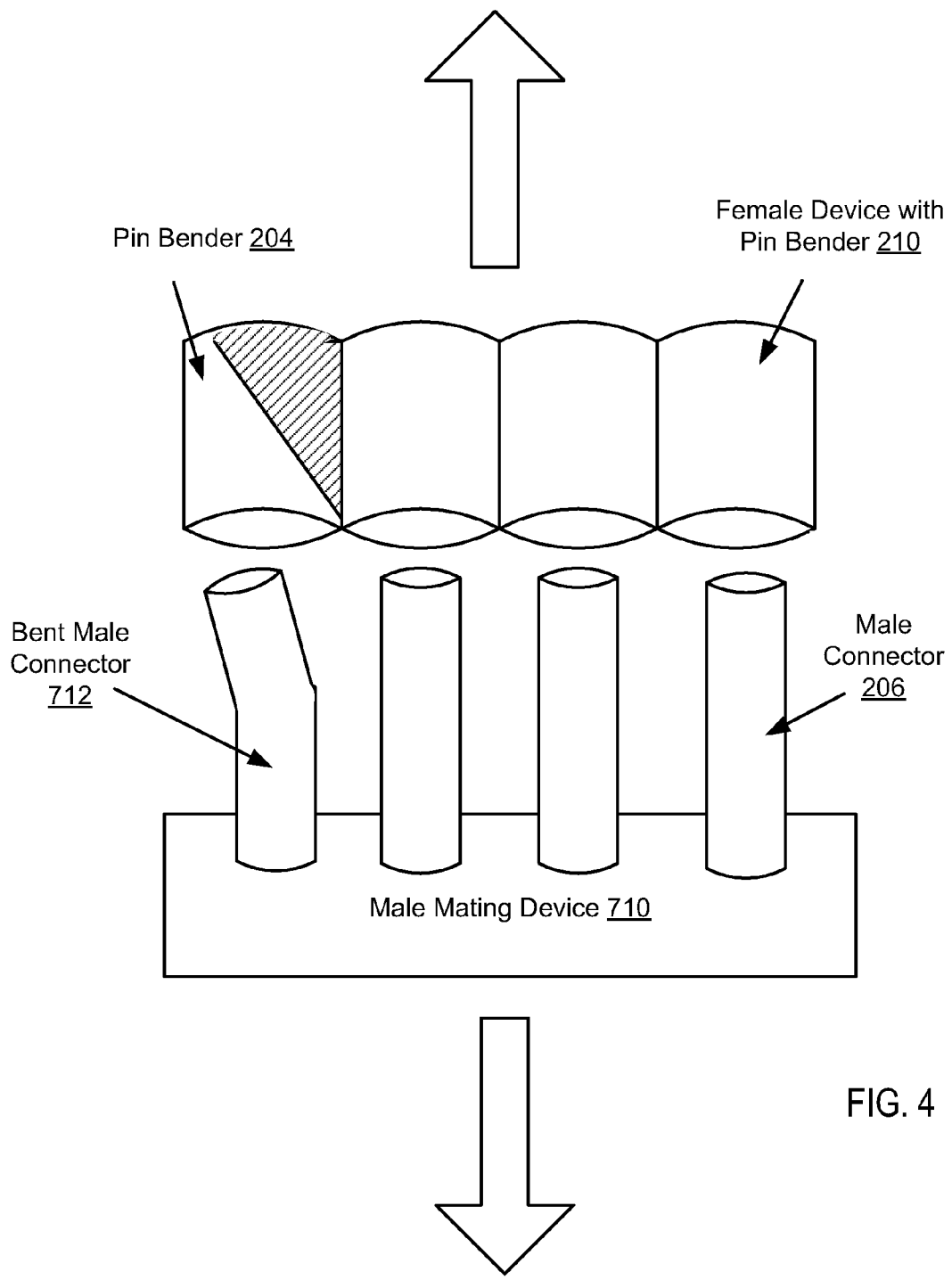
FIG. 4 sets forth a block diagram of the male mating device and the pin bender of FIG. 3 after bending one of a plurality of connectors of a first mating device in accordance with the present invention.

For further explanation, FIGS. 3 and 4 illustrate bending one of a plurality of connectors of a first mating device. FIG. 3 sets forth a block diagram of a male mating device and a pin bender illustrating bending one of a plurality of connectors of a first mating device. In the example of FIG. 3, a male mating device (710) having a plurality of male connectors (206) is mated with a female mating device (210) that includes a pin bender (204) in the female connector corresponding with one (712) of the male connectors to be bent. Mating the female device having the pin bender (210) with the male mating device (710) bends the male connector (712) because the pin bender (204) has an angled open interior designed to bend the male connector (712) at a predetermined angle.

FIG. 4 sets forth a block diagram of the male mating device and a pin bender of FIG. 3 after bending one of a plurality of connectors of a first mating device in accordance with the present invention. After mating the male mating device (710) having a plurality of male connectors (206) with a female mating device (210) that includes a pin bender (204) in the female connector corresponding with one (712) of the male connectors, the male connector (712) corresponding to the female position including the pin bender is bent. As shown, below the male mating device (710) having the bent connector (712) may now be used to propagate the pin correction to a an unmodified female mating device by mating the male mating device (710) with the unmodified female mating device.

The exemplary pin bender (204) of FIG. 4 has a hollow tubular female connector that is integrated into a female mating device that is designed to mate with a male connector. This is for explanation, and not for limitation. Alternatively, a pin bender may be implemented as a single hollow tubular female connector that is not integrated into a female mating device. Such a pin bender may bend a single connector of a mating device individually.

Figure 5:
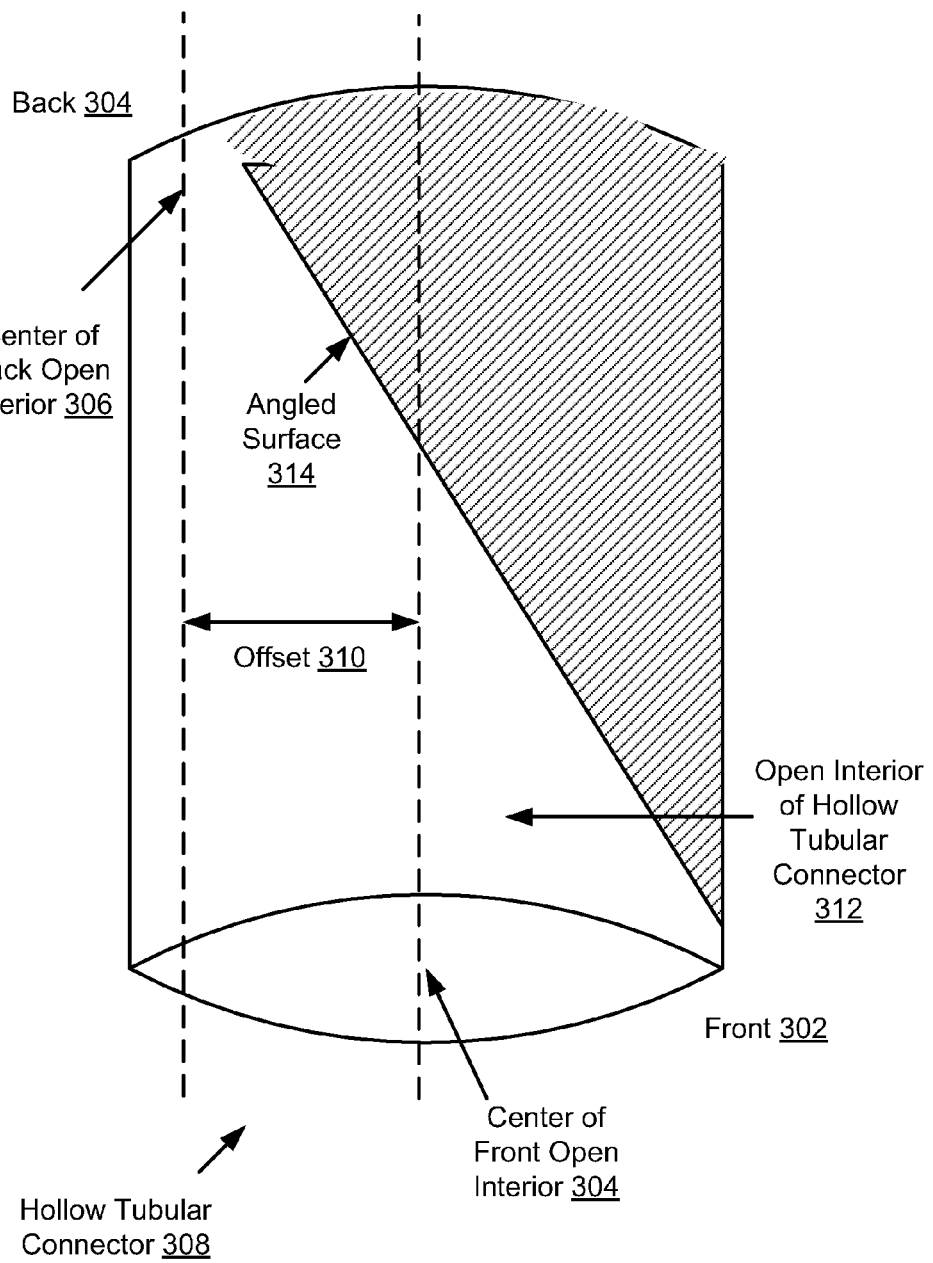
FIG. 5 sets forth a block diagram of a pin bender for propagating pin corrections through physically mating devices.

For further explanation, FIG. 5 sets forth a block diagram of a pin bender for propagating pin corrections through physically mating devices. The pin bender (204) of FIG. 5 includes a hollow tubular female connector (308). The hollow tubular connector (308) is typically designed to accommodate in the front (302) a male connector to be bent. The open interior of the hollow tubular female connector (308) decreases in circumference from the front (302) of the connector to the back (304) of the connector and the center (304) of the open interior (312) at the front (302) of the hollow tubular female connector is offset (310) from the center (306) of the open interior (312) at the back (304) of the connector. The hollow tubular connector thereby provides an angled surface (314) than bends a male connector upon mating the pin bender (204) with the male connector.

The examples of FIGS. 2-5 describe bending one of a plurality of connectors of a first male mating device using a pin bender. Alternatively, propagating pin corrections through physically mating devices according to the present invention may include bending one of a plurality of connectors of a first female mating device. That is, in such cases, the first mating device is a female mating device and bending one of a plurality of connectors of a first mating device is carried out by selecting a female connector on a female mating device and bending the selected female connector to a predetermined angle. Bending the selected female connector to a predetermined angle may be carried out by inserting a bent prong designed to bend the female connector at a predetermined angle.

The use of a pin bender as described with reference to FIGS. 2-5 is for bending one of a plurality of connectors of the first mating device is also for explanation and not for limitation. In fact, there are many ways to bend a connector on a mating device and all such ways are well within the present invention.

Again with reference to FIG. 2: After bending (702) one (712) of a plurality of connectors of a first mating device (710) propagating pin corrections through physically mating devices according to the method of FIG. 2 includes mating (704) the first mating device (710) having the bent connector (712) with an unmodified second mating device (714). Mating (704) of the first mating device (710) and the unmodified second mating device (714) bends a connector (716) corresponding to the bent connector (712) of the first mating device (710). In this way, the pin correction of the first mating device (710) is propagated to the second mating device (714) through physically mating the devices.

Figure 6:
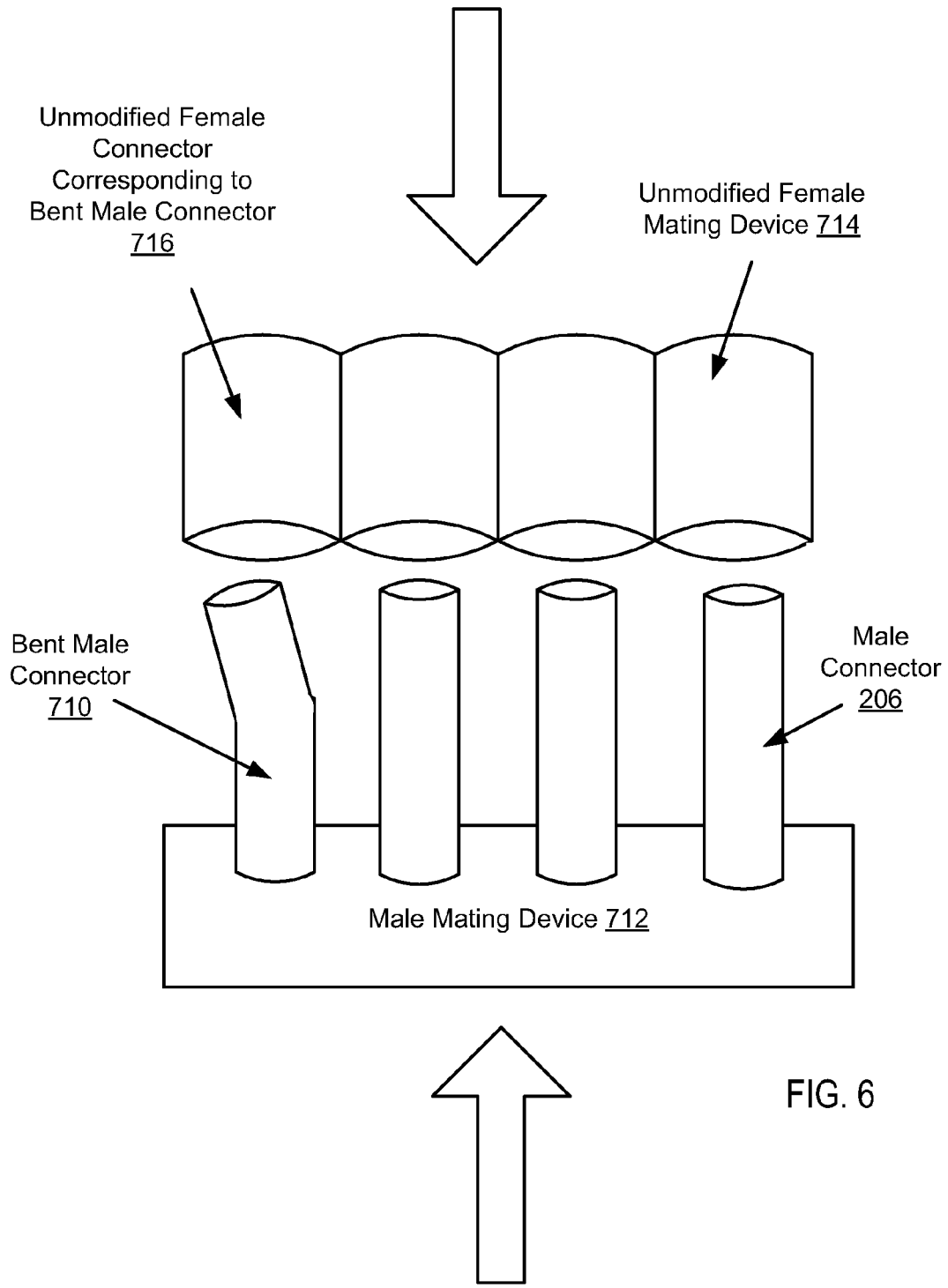
FIG. 6 sets forth a block diagram of a first mating device and an unmodified female mating device illustrating mating the first mating device having the bent connector with an unmodified second mating device.
Figure 7:
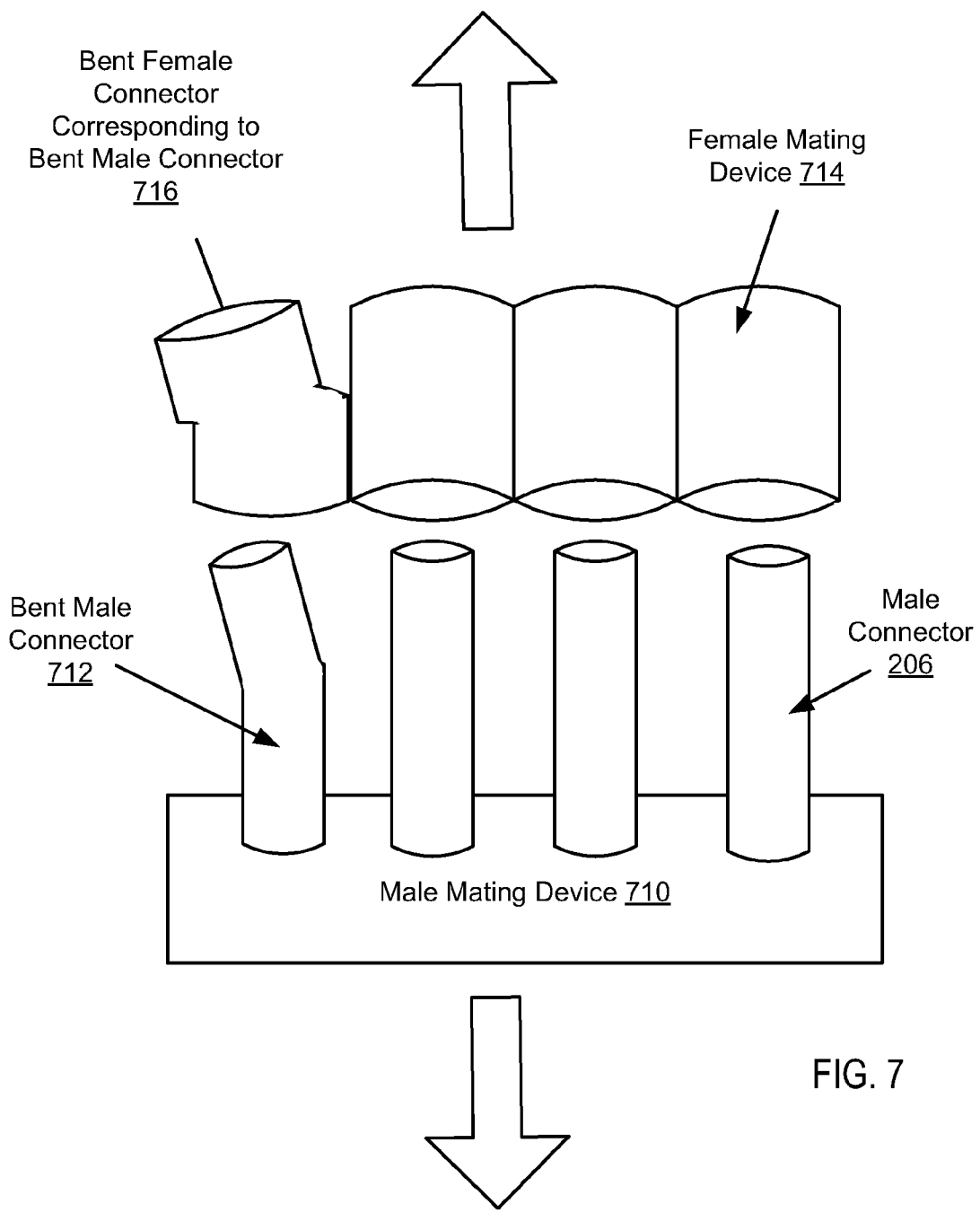
FIG. 7 sets forth a block diagram of a first mating device and an unmodified female mating device that illustrates the result of mating first mating device and an unmodified female mating device as shown in FIG. 6.

For further explanation, FIGS. 6 and 7 set forth block diagrams of a first mating device (712) and an unmodified female mating device (714) illustrating mating the first mating device (710) having the bent connector (712) with an unmodified second mating device (714). In the example of FIG. 6, a male mating device (712) has a bent male connector (710), Mating the first device having the bent connection with an unmodified second mating device is carried out by inserting the selected bent male connector of the male first mating device into a corresponding female connector of the female second mating device. Mating of the first mating device (710) and the unmodified second mating device (714) bends a connector (716) corresponding to the bent connector (712) of the first mating device (710).

As mentioned above, in alternative embodiments, the first mating device is a female mating device and the second unmodified mating device is a male mating device. In such cases, mating the first female device having the bent connection with an unmodified second male mating device may be carried out by inserting an unmodified male connector of the male second mating device into a corresponding bent female connector of the female first mating device.

FIG. 7 sets forth a block diagram of a first mating device (712) and an unmodified female mating device (714) that illustrates the result of mating first mating device (712) and an unmodified female mating device (714) as shown in FIG. 6. In the example of FIG. 7, the female connector (716) corresponding to the bent male connector (712) is bent. The pin correction of the bent male connector (712) of the male mating device (710) has therefore been propagated to the corresponding female connector 716) of the female mating device (714)

Again with reference to FIG. 2: After mating (704) the first mating device (710) having the bent connector (712) with an unmodified second mating device (714) propagating pin corrections through physically mating devices according to the method of FIG. 2 also includes mating (706) the second mating device (714) having the connector bent (716) by the first mating device (710) with an unmodified third mating device (718). The mating (706) of the second mating device (714) and the unmodified third mating device (718) bends a connector (720) corresponding to the bent connector (716) of the second mating device (714). In this way, the pin correction of the second mating device (714) is propagated to the third mating device (718) through physically mating the devices.

In the example of FIG. 2, the first mating device (710) is a male mating device, the second mating device (714) is a female mating device, and the third mating device (718) is a male mating device. This is for explanation and not for limitation. In fact, propagating pin corrections through physically mating devices may begin by bending a female connector on a female mating device in which case the first mating device is a female mating device, the second mating device is a male mating device, the third mating device is a female mating device and so on as will occur to those of skill in the art Propagating pin corrections through physically mating devices provides a vehicle for enabling or disabling software features. That is, one or more software features may be executed or not executed as a result of having one or more connectors physically bent. For further explanation, FIG. 8 sets forth a flow chart illustrating an exemplary method for software function execution in dependence upon a bent connector in a mating device. The method of FIG. 8 includes mating (806) a first mating device (804) and a second mating device (802) and determining (808) whether one of the plurality of connectors of the first mating device (804) is bent. Determining (808) whether one of the plurality of connectors of the first mating device (804) is bent further comprises identifying that a predetermined connector of the first mating device (804) is making poor contact with a corresponding connector of a second mating device (802).

Figure 8:
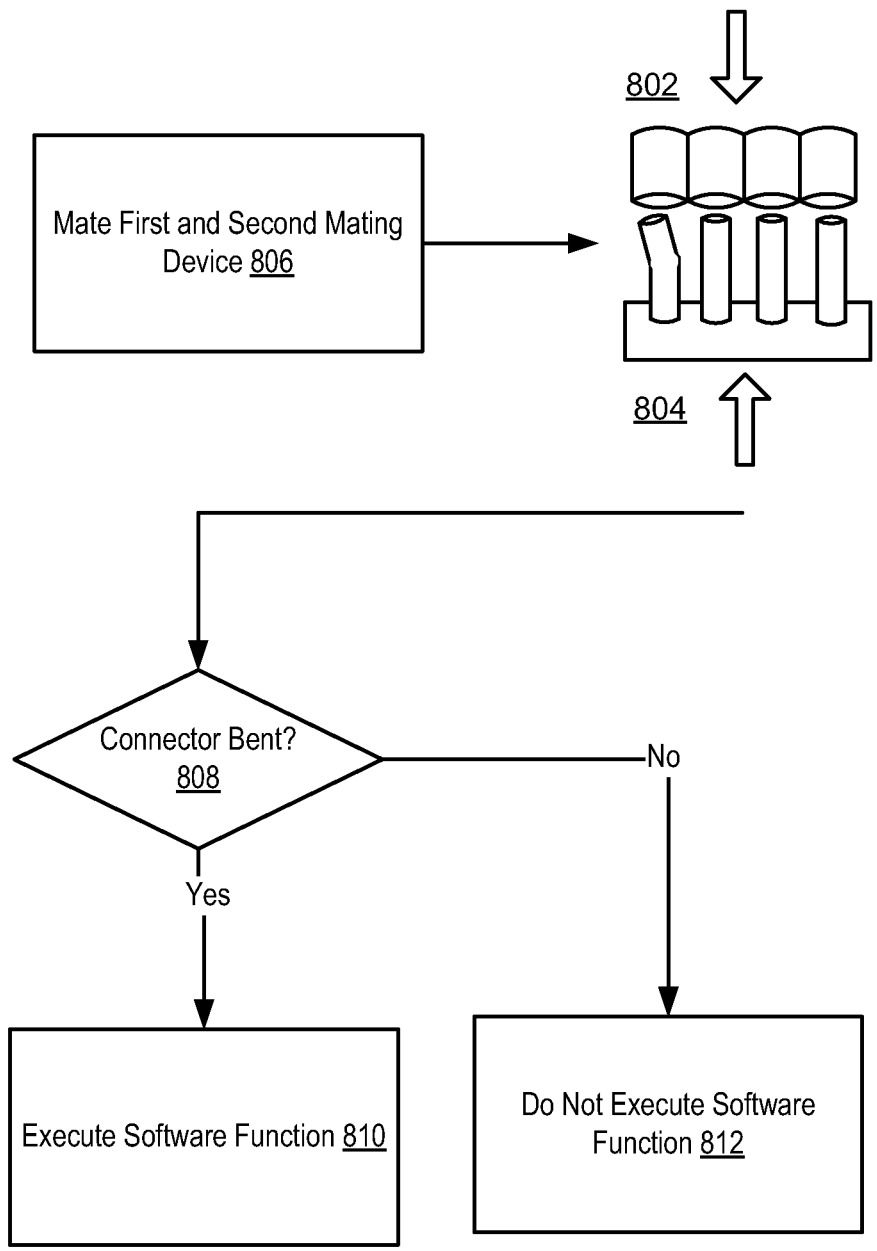
FIG. 8 sets forth a flow chart illustrating an exemplary method for software function execution in dependence upon a bent connector in a mating device.

If the one of connectors of the first mating device (804) is bent, the method of FIG. 8 includes executing (810) a software function. The software function may be any software function such as a function enabling security features, a function disabling or modifying security features, or any other software function that will occur to those of skill in the art.

If the one of the plurality of connectors of the first mating device (804) is not bent, the method of FIG. 8 includes not executing (812) a software function. In the method of FIG. 8, therefore if the pin correction is not propagated to the currently installed mating device, the software function tied to that pin correction is not execute.

In the example of FIG. 8 the first mating device (804) is a male mating device and the second mating device (802) is a female mating device. This is for explanation and not for limitation. Alternatively, the first mating device may be a female mating device and the second mating device may be a male mating device.

Exemplary embodiments of the present invention are described largely in the context of a fully functional system for propagating pin corrections through physically mating devices, and software function execution. Readers of skill in the art will recognize, however, that some embodiments of software function execution according to the present invention also may be embodied in a computer program product disposed on signal bearing media for use with any suitable data processing system. Such signal bearing media may be transmission media or recordable media for machine-readable information, including magnetic media, optical media, or other suitable media. Examples of recordable media include magnetic disks in hard drives or diskettes, compact disks for optical drives, magnetic tape, and others as will occur to those of skill in the art. Examples of transmission media include telephone networks for voice communications and digital data communications networks such as, for example, Ethernets™ and networks that communicate with the Internet Protocol and the World Wide Web as well as wireless transmission media such as, for example, networks implemented according to the IEEE 802.11 family of specifications. Persons skilled in the art will immediately recognize that any computer system having suitable programming means will be capable of executing the steps of the method of the invention as embodied in a program product. Persons skilled in the art will recognize immediately that, although some of the exemplary embodiments described in this specification are oriented to software installed and executing on computer hardware, nevertheless, alternative embodiments implemented as firmware or as hardware are well within the scope of the present invention.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A method for propagating pin corrections through physically mating devices, the method comprising:
    bending one of a plurality of connectors of a first mating device; and
    mating the first mating device having the bent connector with an unmodified second mating device; wherein the mating of the first mating device and the unmodified second mating device permanently bends a connector corresponding to the bent connector of the first mating device.

2. The method of claim 1 wherein the first mating device is a male mating device and the second mating device is a female mating device.

3. The method of claim 1 wherein the first mating device is a female mating device and the second mating device is a male mating device.

4. The method of claim 1 further comprising:
    mating the second mating device having the connector bent by the first mating device with an unmodified third mating device; wherein the mating of the second mating device and the unmodified third mating device bends a connector corresponding to the bent connector of the second mating device.

5. The method of claim 1 wherein bending one of a plurality of connectors of a first mating device further comprises:
    selecting a male connector on a male mating device; and
    bending the selected male connector to a predetermined angle.

6. The method of claim 5 wherein bending the selected male connector to a predetermined angle further comprises inserting the selected male connector into a pin bender having an interior designed to bend the connector at a predetermined angle.

7. The method of claim 1 wherein bending one of a plurality of connectors of a first mating device further comprises:
    selecting a female connector on a female mating device; and
    bending the selected female connector to a predetermined angle.

* * * * *